(12) United States Patent
Chen et al.

(10) Patent No.: US 10,913,301 B2
(45) Date of Patent: Feb. 9, 2021

(54) ARRAY-TYPE ELECTRODE, DIGITAL PRINTING MOLD AND METHOD FOR MANUFACTURING ARRAY-TYPE ELECTRODE

(71) Applicant: Industrial Technology Research Institute, Hsin-Chu (TW)

(72) Inventors: Wei-Yuan Chen, Taichung (TW); Yu-Ming Wang, Hsinchu (TW); Sheng-Yu Lin, Miaoli County (TW); Yi-Wei Lin, Taichung (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 335 days.

(21) Appl. No.: 15/854,247

(22) Filed: Dec. 26, 2017

(65) Prior Publication Data

US 2019/0135010 A1 May 9, 2019

(30) Foreign Application Priority Data

Nov. 7, 2017 (TW) .............................. 106138499 A (51) Int. Cl.
*B32B 3/10* (2006.01)
*B41M 5/00* (2006.01)
(Continued)

(52) U.S. Cl.
CPC ............. *B41M 5/0041* (2013.01); *B32B 7/04* (2013.01); *B41M 5/0082* (2013.01); *B41M 7/0036* (2013.01); *H05K 3/101* (2013.01); *B32B 15/04* (2013.01); *B32B 2457/08* (2013.01); *B41M 99/00* (2013.01); *H05K 3/426* (2013.01);
(Continued)

(58) Field of Classification Search
None
See application file for complete search history.

(56) References Cited

U.S. PATENT DOCUMENTS 6,565,727 B1 5/2003 Shenderov
8,409,417 B2 4/2013 Wu
(Continued)

FOREIGN PATENT DOCUMENTS

CN 105189108 A 12/2015
CN 204904249 U 12/2015
(Continued)

OTHER PUBLICATIONS

Machine translation of CN 106449381 (Year: 2017).*
(Continued)

*Primary Examiner* — Christopher M Polley
(74) *Attorney, Agent, or Firm* — WPAT, PC (57) ABSTRACT

An array-type electrode, which may include a substrate, an isolating layer, an electrode and a micro-structure layer. The isolating layer may be disposed on one side of the substrate. The first part of the electrode may be disposed on one side of the substrate and covered by the isolating layer; the second part of the electrode penetrates through the substrate; the third part of the electrode may be disposed on the other side of the substrate; the first part may be connected to the third part via the second part. The micro-structure layer may be disposed on the isolating layer.

12 Claims, 8 Drawing Sheets

(51) Int. Cl.
*H05K 3/10* (2006.01)
*B32B 7/04* (2019.01)
*B41M 7/00* (2006.01)
*B41M 99/00* (2006.01)
*H05K 3/42* (2006.01)
*B32B 15/04* (2006.01)

(52) U.S. Cl.
CPC ............... *H05K 2203/0117* (2013.01); *Y10T 428/24802* (2015.01)

(56) References Cited

U.S. PATENT DOCUMENTS

| | | |
|---|---|---|
| 2004/0055891 A1 | 3/2004 | Pamula et al. |
| 2012/0305400 A1 | 12/2012 | Nelson et al. |
| 2017/0097502 A1 | 4/2017 | Petcu et al. |
| 2017/0120591 A1 | 5/2017 | North et al. |

FOREIGN PATENT DOCUMENTS

| | | | | |
|---|---|---|---|---|
| CN | 106449381 A | * | 2/2017 | |
| CN | 106449381 A | | 2/2017 | |
| CN | 107111401 A | | 8/2017 | |
| KR | 20080069094 A | | 7/2008 | |
| TW | 201714757 A | | 5/2017 | |
| WO | WO2015142927 | | 9/2015 | |
| WO | WO-2017069129 A1 | * | 4/2017 | ............ B41J 2/1628 |

OTHER PUBLICATIONS

Taiwan Intellectual Property Office, "Office Action", dated Oct. 4, 2018.

CN OA dated Jun. 12, 2020.

Sung Kwon Cho et al., "Creating, Transporting, Cutting, and Merging Liquid Droplets by Electrowetting-Based Actuation for Digital Microfluidic Circuits", Feb. 2003, pp. 70-80, vol. 12, No. 1, Journal of Microelectromechanical Systems.

Junghoon Lee et al, "Electrowetting and electrowetting-on-dielectric for microscale liquid handling", Jan. 1, 2002, pp. 259-268, Sensors and Actuators A 95, Elsevier Science B. V.

R. Malk et al, "EWOD-driven stifling in lab-on-a-chips Dependence on the electrodes' geometry", Apr. 30, 2012, pp. 306-310, Microelectronic Engineering 97, Elsevier B.V.

Arghya Narayan Baneflee et al, "High-speed droplet actuation on single-plate electrode arrays", Jul. 18, 2011, pp. 567-574,Journal of Colloid and Interface Science, Elsevier Inc.

Jeong Hyun Lee et al, "Mobile oscillating bubble actuated by ACelectrowetting-on-dielectric (EWOD) for microfluidic mixing enhancement", May 22, 2012, pp. 153-162, Sensors and Actuators A 182, Elsevier B.V.

Guowei Lv et al, "Rapid fabrication of electrohydrodynamic micro-/nanostructures with high aspect ratio using a leaky dielectric photoresist", Jun. 27, 2017, 2017, pp. 1-9, Reactive and Functional Polymers 118, Elsevier B.V.

* cited by examiner

ARRAY-TYPE ELECTRODE, DIGITAL PRINTING MOLD AND METHOD FOR MANUFACTURING ARRAY-TYPE ELECTRODE

CROSS REFERENCE TO RELATED APPLICATION

All related applications are incorporated by reference. The present application is based on, and claims priority from, Taiwan Application Serial Number 106138499, filed on Nov. 7, 2017, the disclosure of which is hereby incorporated by reference herein in its entirety.

TECHNICAL FIELD

The technical field relates to an electrode structure, in particular to an array-type electrode. The technical field further relates to a digital printing mold including the array-type electrode, and a method for manufacturing the array-type electrode.

BACKGROUND

In general, if conventional printing techniques, such as screen printing, gravure printing, or flexo printing, are used to print a pattern, it is necessary to manufacture a printing mold corresponding to the pattern. Thus, it is necessary to manufacture a lot of molds in order to print different patterns. Therefore, it is the future trend to digitalize printing molds.

Figure 1:
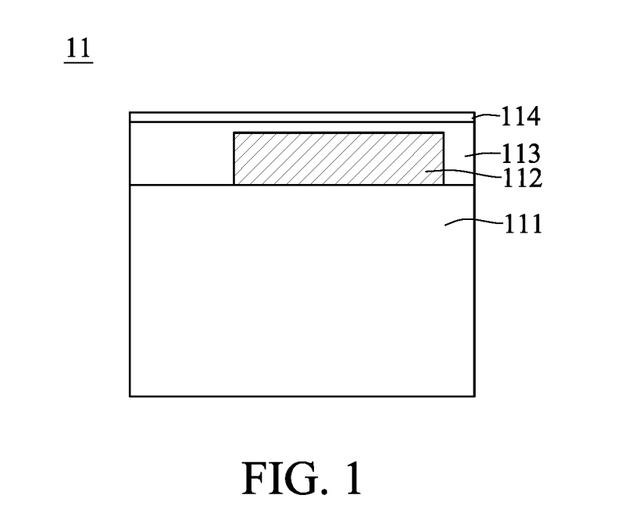
FIG. 1 is a schematic view of a currently available array-type electrode.
Figure 2:
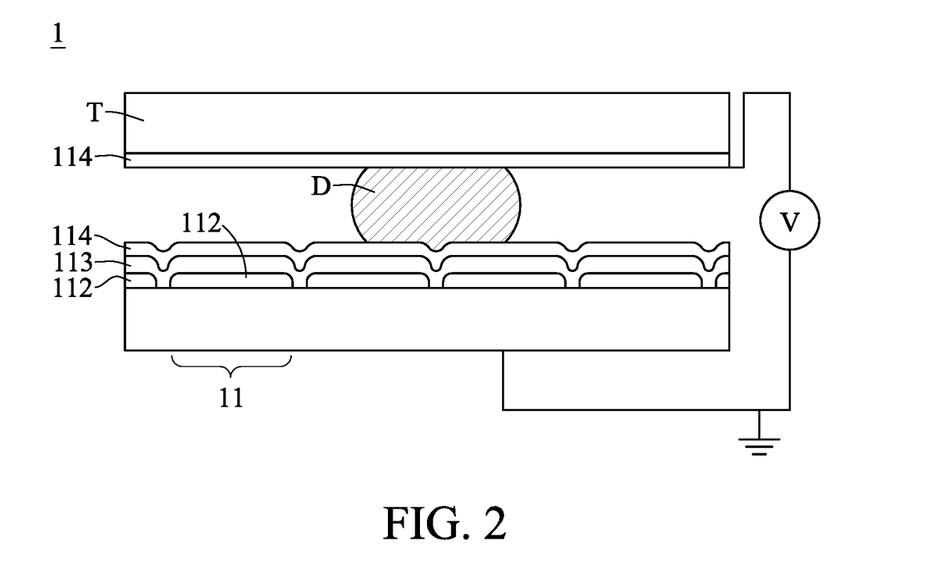
FIG. 2 is a schematic view of a parallel-type electrode array composed of the array-type electrodes.

FIG. 1 and FIG. 2 are a schematic view of a currently available array-type electrode, and a schematic view of a parallel-type electrode array composed of the array-type electrodes respectively.

As shown in FIG. 1, the array-type electrode 11 includes a substrate 11, a driving electrode 112, an isolating layer 113, and a hydrophobic layer 114.

As shown in FIG. 2, several array-type electrodes 11 and a top plate T form a parallel-type electrode array 1, and the bottom of the top plant is provided with the hydrophobic layer 114. A power source V applies voltage to the top plate T and the array-type electrodes 11 to generate electric field between them, which can change the contact angle between the droplet D and the array-type electrodes 11. In this way, the droplet D can move between the top plate T and the array-type electrodes 11.

SUMMARY

An embodiment of the present disclosure relates to an array-type electrode, which may include a substrate, an isolating layer, an electrode and a micro-structure layer. The isolating layer may be disposed on one side of the substrate. The first part of the electrode may be disposed on one side of the substrate and covered by the isolating layer; the second part of the electrode penetrates through the substrate; the third part of the electrode may be disposed on the other side of the substrate; the first part may be connected to the third part via the second part. The micro-structure layer may be disposed on the isolating layer.

Another embodiment of the present disclosure relates to a method for manufacturing array-type electrode, which may include the following steps: providing a substrate; adhering a first metal layer to one side of the substrate, and adhering a second metal layer to the other side of the substrate; etching the first metal layer and the second metal layer to form a driving electrode part and a conductive part respectively; perforating the substrate, the driving electrode part, and the conductive part to form a through hole; and executing an electroplating process to form a connection part in the through hole to connect the driving electrode part to the conductive part.

The other embodiment of the present disclosure relates to a digital printing mold, which may include an electrode array. The electrode array may include a plurality of array-type electrodes, and each of the array-type electrodes includes a substrate, an isolating layer, an electrode and a micro-structure layer. The isolating layer may be disposed on one side of the substrate. The first part of the electrode may be disposed on one side of the substrate and covered by the isolating layer; the second part of the electrode penetrates through the substrate; the third part of the electrode may be disposed on the other side of the substrate; the first part may be connected to the third part via the second part. The micro-structure layer may be disposed on the isolating layer.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 3:
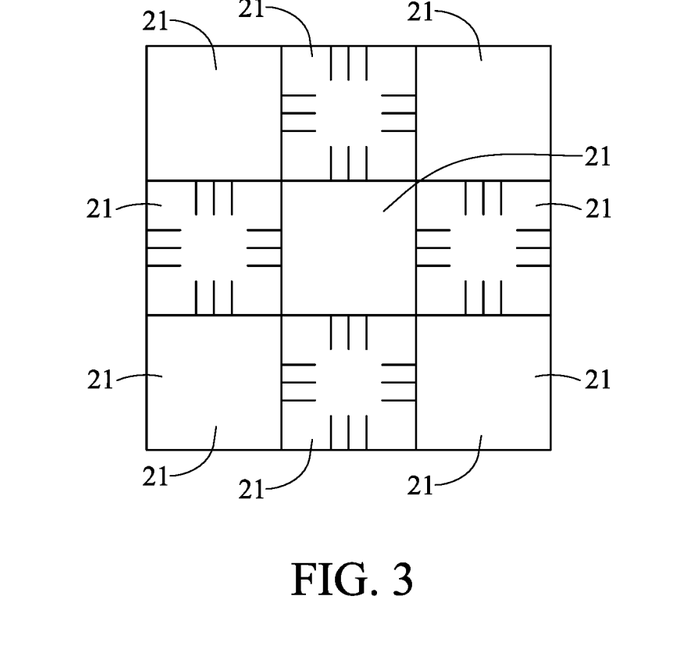
FIG. 3 is a top view of a digital printing mold of a first embodiment in accordance with the present disclosure.
Figure 4:
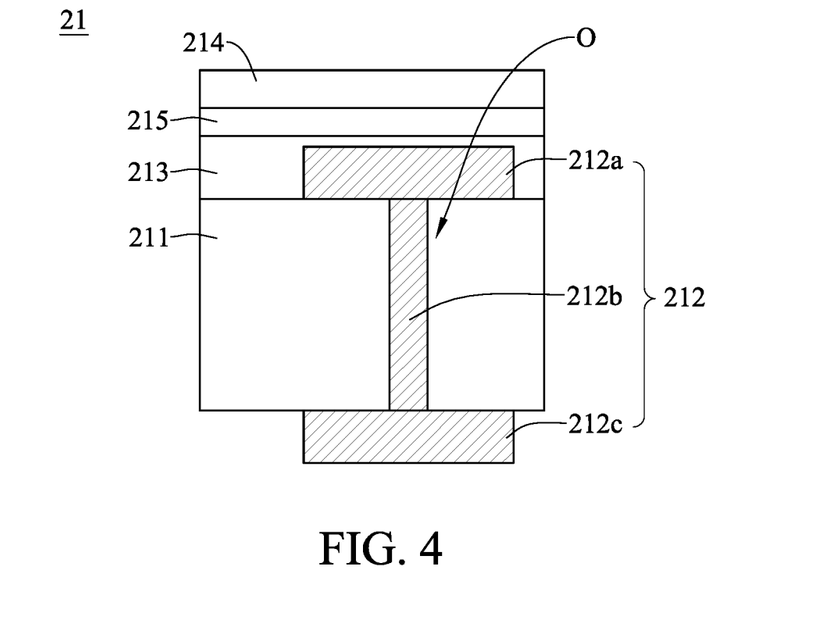
FIG. 4 is a cross-sectional view of the digital printing mold of the first embodiment in accordance with the present disclosure.
Figure 5:
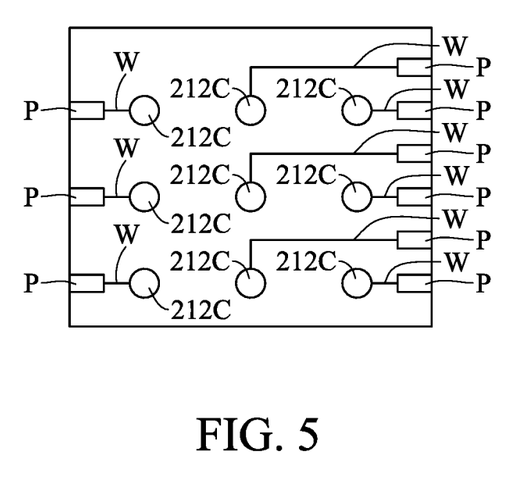
FIG. 5 is a bottom view of the digital printing mold of the first embodiment in accordance with the present disclosure.

Please refer to FIG. 3, FIG. 4, and FIG. 5; FIG. 3 is a top view of a digital printing mold of a first embodiment in accordance with the present disclosure. As shown in FIG. 3, the digital printing mold 2 includes an electrode array, and the electrode array includes a plurality of array-type electrodes 21. These array-type electrodes 21 generate electric field to move the ink on the array-type electrodes 21 to form a desired pattern.

FIG. 4 is a cross-sectional view of the digital printing mold of the first embodiment in accordance with the present disclosure. As shown in FIG. 4, each of array-type electrodes 21 includes a substrate 211, an electrode 212, an isolating layer 213, a micro-structure layer 215, and a hydrophobic layer 214.

The isolating layer 213 is disposed on one side of the substrate 211, and the substrate 211 includes a through hole O. In an embodiment, the substrate 211 may be a printing circuit board (PCB) or other similar materials; the isolating layer 213 may be a $SiO_2$ layer, $Si_3N_4$ layer, photoresist layer or other similar materials; the hydrophobic layer 214 may be Teflon (PTFB) or other similar materials.

The electrode 212 includes three parts: the first part is a driving electrode part 212a, which is disposed on one side of the substrate 211, and covered by the isolating layer 213. The second part is a connection part 212b, which is disposed inside the through hole O, and penetrates through the substrate 211. The third part is a conductive part 212c, which is disposed on the other side of the substrate 211. The driving electrode part 212a is connected to the conductive part 212c via the connection part 212b. In an embodiment, the electrode 212 may be a copper electrode.

As shown in FIG. 4, the micro-structure layer 215 is disposed on the isolating layer 213, and the surface of the micro-structure layer 215 is rough, and includes a plurality of protrusions. In an embodiment, the micro-structure layer 215 may be formed on the isolating layer 213 by the imprinting process.

The hydrophobic layer 214 is disposed on the micro-structure layer 215.

FIG. 5 is a bottom view of the digital printing mold of the first embodiment in accordance with the present disclosure. As shown in FIG. 5, the conductive part 212c of each of array-type electrodes 21 is connected to a pin P via a trace W to connect to a power source, such that the power source can activate the driving electrode part 212a to generate the electric field, which can move the ink to form the desired pattern.

Figure 6:
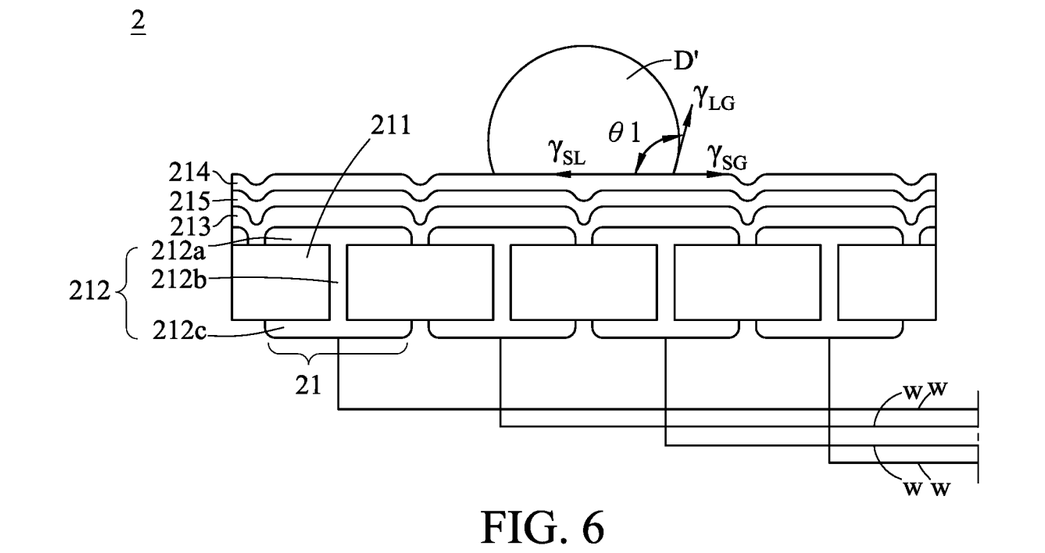
FIG. 6 is a first schematic view of the digital printing mold of the first embodiment in accordance with the present disclosure.
Figure 7:
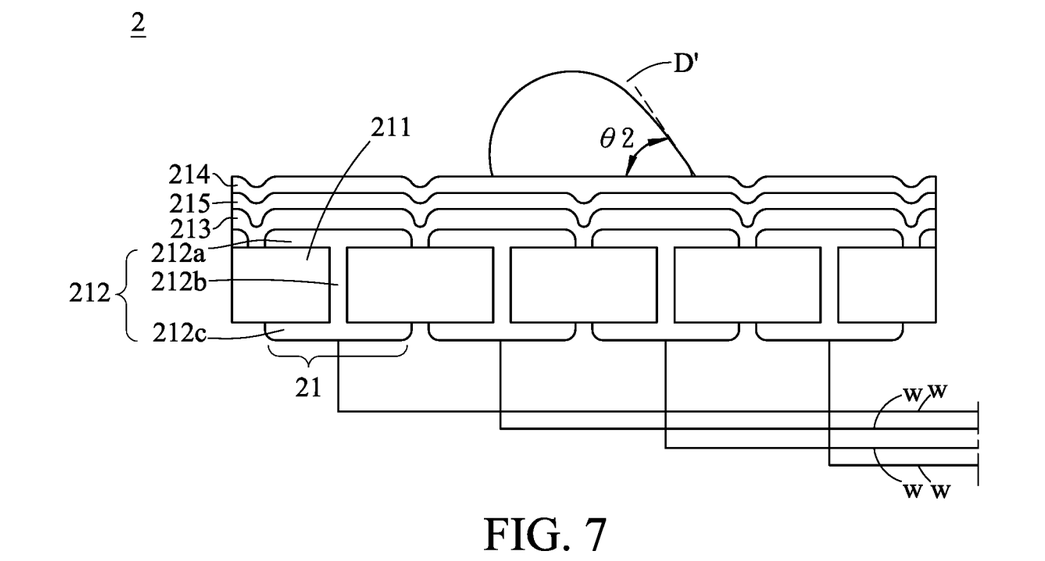
FIG. 7 is a second schematic view of the digital printing mold of the first embodiment in accordance with the present disclosure.

Please refer to FIG. 6 and FIG. 7; FIG. 6 and FIG. 7 are a first schematic view and a second schematic view of the digital printing mold of the first embodiment in accordance with the present disclosure respectively.

As shown in FIG. 6, the driving electrode parts 212a of the array-type electrodes 21 are disposed on one side of the substrate 211. The traces W of the array-type electrodes 21 are connected to the conductive parts 212c disposed on the other side of the substrate 211, such that the plane where the driving electrodes 212a of the array-type electrodes 21 are disposed is different from the plane where the traces W of the array-type electrodes 21 is disposed. In this way, the electric field generated by the trances W of the array-type electrodes 21 will not interfere with the ink, so the ink can move along the desired path to precisely form the desired pattern.

In addition, as shown in FIG. 6, when the ink D' is on the surfaces of the array-type electrodes 21, the interfacial tensions applied to the ink D' includes (1) solid-liquid interfacial tension $\gamma_{SL}$; (2) solid-gas interfacial tension $\gamma_{SG}$; (3) liquid-gas interfacial tension $\gamma_{LG}$; the relation between the contact angle θ1 and the above interfacial tensions is as shown in Equation (1):

$$\gamma_{SG} = \gamma_{SL} + \gamma_{LG} \cos \theta1 \qquad (1)$$

In the embodiment, as the surface of the micro-structure layer 215 of each array-type electrode 21 is rough, and includes a plurality of protrusions. Thus, the initial contact angle θ1 between the ink D' and the surfaces of the array-type electrodes 21 can be increased before the array-type electrodes 21 applies the electric field to the ink D'.

Regarding the above tensions, the solid-liquid interfacial tension $\gamma_{SL}$ can be adjusted by the electric field, generated by the applied voltage, applied to the ink D', as shown in Equation (2):

$$\gamma_{SL}(V) = \gamma_{SL}|_{v=0} - C/2 * V^2 \qquad (2)$$

In Equation (2), V stands for the voltage applied to the ink D'; C stands for the capacitance of the dielectric layer.

As shown in FIG. 7, after the array-type electrodes 21 apply the electric field to the ink D', the ink D' is asymmetrically deformed. Therefore, the contact angle between the ink D' and the surfaces of the array-type electrodes 21 is decreased to be θ2, as shown in Equation (3). Thus, the ink D' can move on the surfaces of the array-type electrodes 21.

$$\cos \theta2 - \cos \theta1 = \varepsilon_r \varepsilon_0 2t\gamma_{LG} * V^2 \qquad (3)$$

Equation (3) can be derived from Equation (1) and Equation (2); in Equation (3), $\varepsilon_0$ stands for the vacuum permittivity; $\varepsilon_r$ stands for the permittivity of the isolating layer; t stands for the thickness of the isolating layer.

As described above, as the array-type electrodes 21 of the embodiment includes the micro-structure layers 215, the initial contact angle θ1 between the ink D' and the surfaces of the array-type electrodes 21 can be significantly increased. For the reason, the digital printing mold 2 can result in enough change to the contact angle without high voltage, and can control the ink D' to move along the desired path. Therefore, the digital printing mold 2 can save more energy and will not be damaged by high temperature.

In the embodiment, the digital printing mold can change different patterns by moving the ink, so it no longer needs to manufacture a lot of different printing molds for different patterns, and the patterns form by the digital printing mold can have higher resolution. Thus, the digital printing mold can satisfy the current market trend, small-volume and large-variety, the cost of the printing process can be significantly reduced, and the efficiency of the printing process can be improved.

Moreover, each of the array-type electrodes of the digital printing mold of the embodiment has a special structure design, wherein the plane where the traces of the array-type electrodes of the digital printing mold are disposed is different from the plane where the driving electrodes of the array-type electrodes are disposed, so the electric field generated by the traces will not interfere with the ink. Therefore, the ink can move along the desired path to precisely from the desired pattern. Furthermore, each of the array-type electrodes of the digital printing mold has the micro-structure layer, so the digital printing mold can save more energy and will not be damaged by high temperature. As described above, the digital printing mold of the embodiment can definitely achieve great technical effect.

Please refer to FIG. 8A~FIG. 8G; FIGS. 8A~8G are first~ninth schematic views of a manufacturing process of the array-type electrodes of the digital printing mold of the first embodiment in accordance with the present disclosure respectively.

Figure 8A:
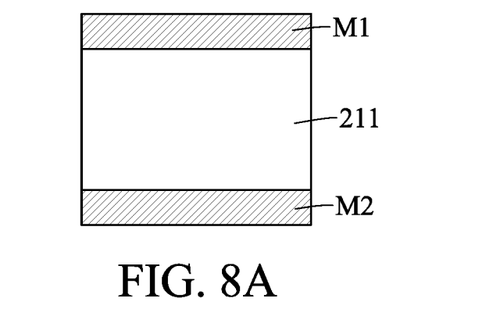
FIG. 8A~8G are first~ninth schematic views of a manufacturing process of the array-type electrodes of the digital printing mold of the first embodiment in accordance with the present disclosure respectively.

First, a first metal layer M1 is adhered to one side of a substrate 211, and then a second metal layer M2 is adhered to the other side of the substrate 211, as shown in FIG. 8A.

Figure 8B:
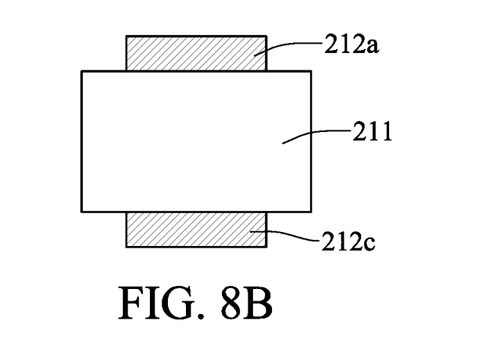

Next, the first metal layer M1 and the second metal layer M2 are etched by the lithography etching process in order to form a driving electrode part 212a and a conductive part 212c, as shown in FIG. 8B.

Figure 8C:
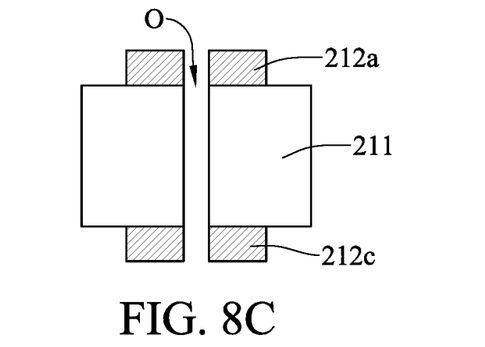

Then, the substrate 211, the driving electrode 212a, and the conductive part 212c are perforated to form a through hole O, as shown in FIG. 8C.

Figure 8D:
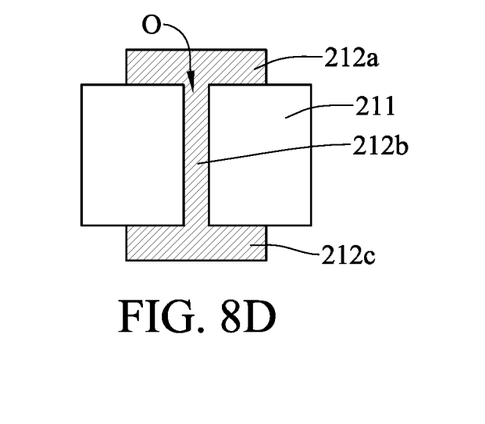

After that, a connection part 212b is formed in the through hole O by the electroplating process in order to connect the driving electrode part 212a to the conductive part 212c, as shown in FIG. 8D.

Figure 8E:
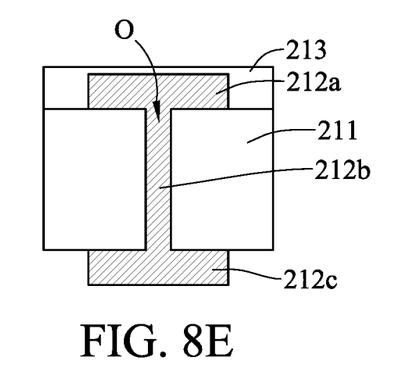

Afterward, an isolating layer 213 is formed on the substrate 211 to cover the driving electrode part 212a, as shown in FIG. 8E.

Figure 8F:
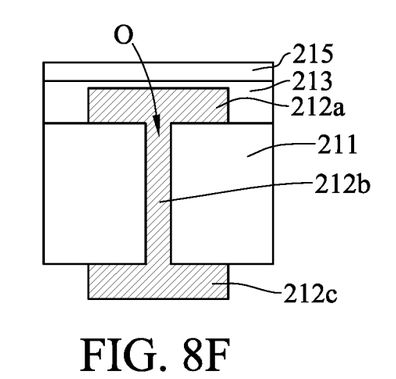

Then, a micro-structure layer 215 is formed on the isolating layer 213 by the imprinting process, as shown in FIG. 8F.

Figure 8G:
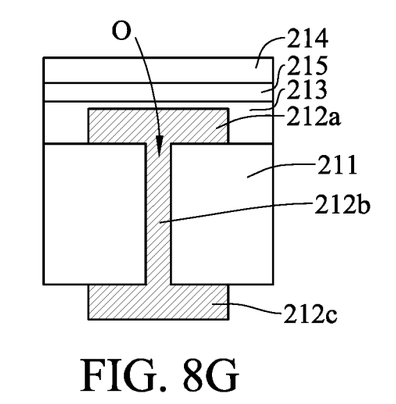

Finally, a hydrophobic layer 214 is formed on the micro-structure layer 215, as shown in FIG. 8G.

Figure 9:
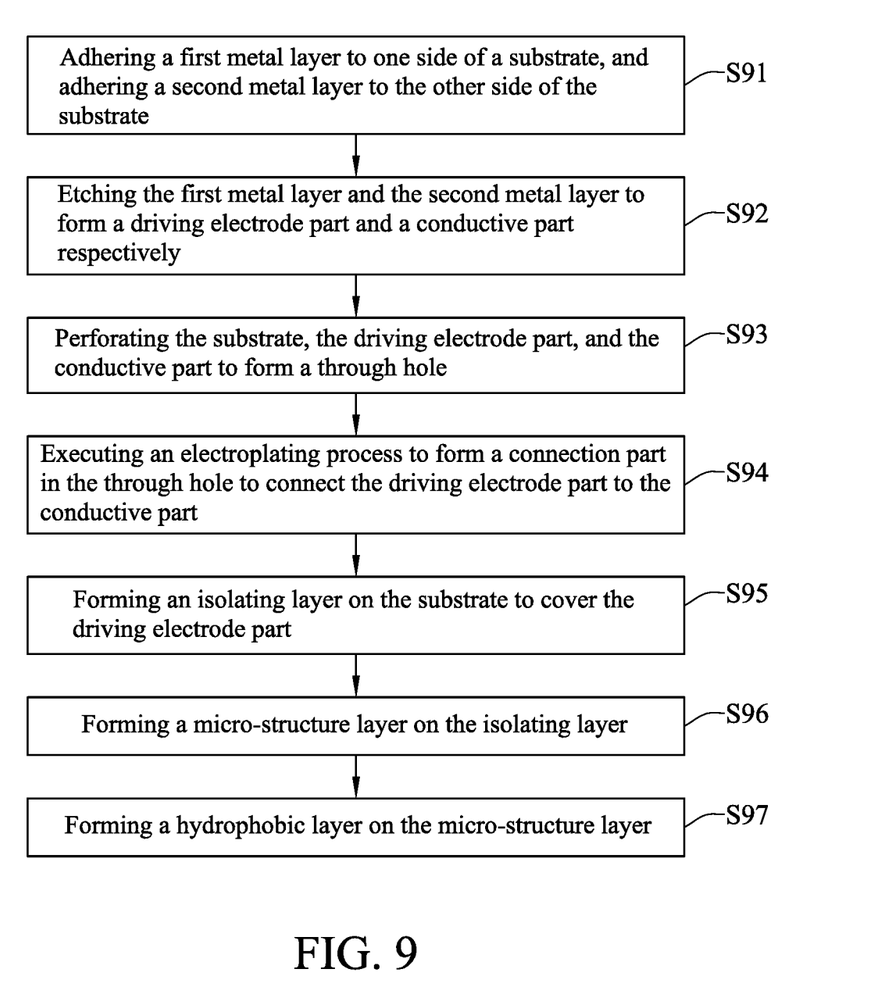
FIG. 9 is a flowchart of a method for manufacturing the array-type electrodes of the digital printing mold of the first embodiment in accordance with the present disclosure.

Please refer to FIG. 9; FIG. 9 is a flowchart of a method for manufacturing the array-type electrodes of the digital printing mold of the first embodiment in accordance with the present disclosure. The method for manufacturing the array-type electrodes of the embodiment includes the following steps:

Step S91: adhering a first metal layer to one side of a substrate, and adhering a second metal layer to the other side of the substrate Step S92: etching the first metal layer and the second metal layer to form a driving electrode part and a conductive part respectively.

Step S93: perforating the substrate, the driving electrode part, and the conductive part to form a through hole.

Step S94: executing an electroplating process to form a connection part in the through hole to connect the driving electrode part to the conductive part.

Step S95: forming an isolating layer on the substrate to cover the driving electrode part.

Step S96: forming a micro-structure layer on the isolating layer.

Step S97: forming a hydrophobic layer on the micro-structure layer.

The embodiment just exemplifies the present disclosure and is not intended to limit the scope of the present disclosure. Any equivalent modification and variation according to the spirit of the present disclosure is to be also included within the scope of the following claims and their equivalents.

It is worthy to point out that if conventional printing techniques are used to print different patterns, it is necessary to manufacture a lot of molds corresponding to these patterns. However, high-precision printing molds are very expensive, so the cost of the printing process has never been effectively reduced. Besides, it needs to spend about 3~4 weeks on manufacturing a printing mold, so the printing process is always inefficient. On the contrary, according to one embodiment of the present disclosure, the digital printing mold can change different patterns by moving the ink, so it no longer needs to manufacture a lot of different printing molds for different patterns, and the patterns form by the digital printing mold can have higher resolution. Thus, the cost of the printing process can be significantly reduced, and the efficiency of the printing process can be improved.

Besides, when using a printing mold during a printing process, the user should frequently refill the printing mold, and repeatedly scrape the ink from the printing mold, so the printing mold tends to be damaged, which further increases the cost of the printing process. On the contrary, according to one embodiment of the present disclosure, the user does not need to frequently refill the digital printing mold and scrape the ink from the digital printing mold by a scraper. Therefore, the digital printing mold does not tend to be damaged, so the cost of the printing process can be further reduced.

Further, the current trend of printing products is small-volume but large-variety, so the conventional printing techniques can no longer satisfy the requirements of the market. On the contrary, according to one embodiment of the present disclosure, the plane where the traces of the array-type electrodes of the digital printing mold are disposed is different from the plane where the driving electrodes of the array-type electrodes are disposed, so the electric field generated by the traces will not interfere with the ink. Therefore, the ink can move along the desired path to precisely from the desired pattern.

Moreover, according to one embodiment of the present disclosure, each of the array-type electrodes of the digital printing mold has the micro-structure layer, so the initial contact angle between the ink and the surfaces of the array-type electrodes can be significantly increased. Thus, the digital printing mold can result in enough change to the contact angle without high voltage, and can control the ink to move along the desired path. Therefore, the digital printing mold can save more energy and will not be damaged by high temperature.

Furthermore, according to one embodiment of the present disclosure, the digital printing mold can be applied to not only biomedical purposes, but also can be applied to printing process, which is more comprehensive in use.

Please refer to FIG. 10A~FIG. 10D; FIG. 10A~10D are first~fourth schematic views of a digital printing mold of a second embodiment in accordance with the present disclosure respectively. The embodiment illustrates a preferred usage situation of the digital printing mold.

Figure 10A:
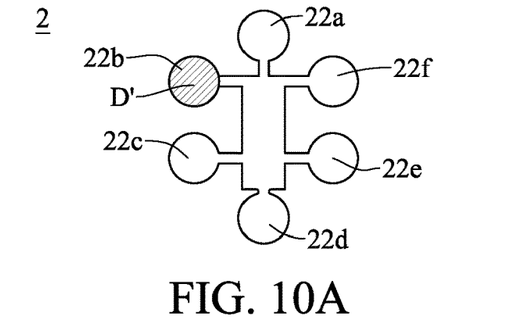
FIG. 10A~FIG. 10D are first~fourth schematic views of a digital printing mold of a second embodiment in accordance with the present disclosure.

As shown in FIG. 10A, the digital printing mold 2 includes an electrode array, and a plurality of storage tanks 22a~22f, and the electrode array includes a plurality of array-type electrodes 21. The ink D' can be contained in any one of the storage tanks 22. In the embodiment, the ink D' is contained in the storage tank 22b at the upper left corner.

Figure 10B:
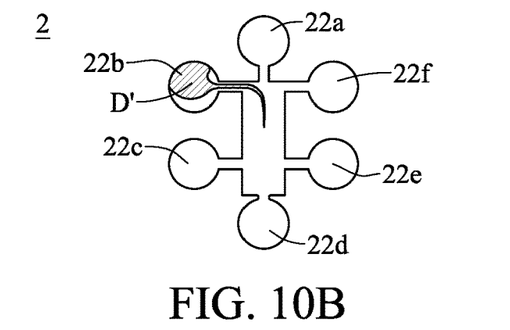

As shown in FIG. 10B, the user can orderly turn on the array-type electrodes 21 from the left side to the right side, so the ink D' can move toward the center of the digital printing mold 2.

Figure 10C:
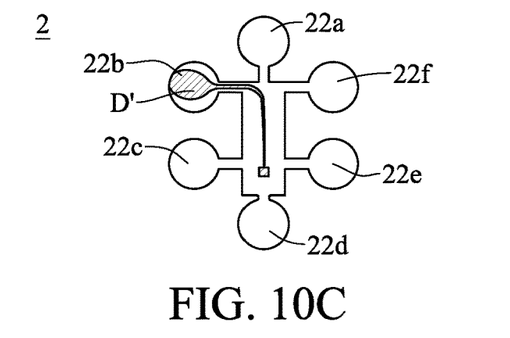

As shown in FIG. 10C, when the ink D' moves to the center of the digital printing mold 2, the user can turn on the array-type electrode 21 at the middle of the digital printing mold 2 to shape the ink D' to be rectangular, and then turn off the array-type electrodes 21 at the upper left corner to disconnect the ink D' from the storage tank 22b.

Figure 10D:
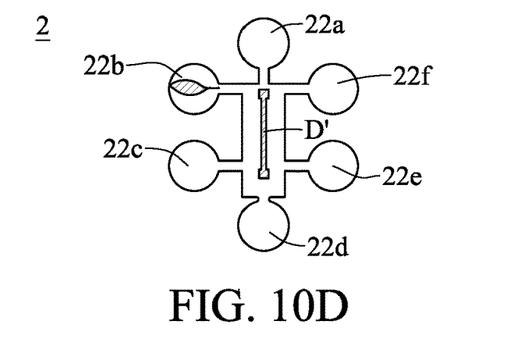

As shown in FIG. 10D, the user can turn on array-type electrodes 21 above and below to reshape the rectangular ink D' to be the pattern "I".

The embodiment just exemplifies the present disclosure and is not intended to limit the scope of the present disclosure. Any equivalent modification and variation according to the spirit of the present disclosure is to be also included within the scope of the following claims and their equivalents.

In summation of the description above, according to one embodiment of the present disclosure, the digital printing mold can change different patterns by moving the ink, so it no longer needs to manufacture different printing molds, and the patterns form by the digital printing mold can have higher resolution. Thus, the cost of the printing process can be significantly reduced, and the efficiency of the printing process can be improved.

According to one embodiment of the present disclosure, the user does not need to frequently refill the digital printing mold and scrape the ink from the digital printing mold by a scraper. Therefore, the digital printing mold does not tend to be damaged, so the cost of the printing process can be further reduced.

Also, according to one embodiment of the present disclosure, the digital printing mold can change the pattern according to actual requirements, so can satisfy the current market trend, small-volume and large-variety.

Further, according to one embodiment of the present disclosure, the plane where the traces of the array-type electrodes of the digital printing mold are disposed is different from the plane where the driving electrodes of the array-type electrodes are disposed, so the electric field generated by the traces will not interfere with the ink. Therefore, the ink can move along the desired path to precisely from the desired pattern.

Moreover, according to one embodiment of the present disclosure, each of the array-type electrodes of the digital printing mold has the micro-structure layer, so the initial contact angle between the ink and the surfaces of the array-type electrodes can be significantly increased. Thus, the digital printing mold can result in enough change to the contact angle without high voltage, and can control the ink to move along the desired path. Therefore, the digital printing mold can save more energy and will not be damaged by high temperature.

Furthermore, according to one embodiment of the present disclosure, the digital printing mold can be applied to not only biomedical purposes, but also can be applied to printing process, which is more comprehensive in use.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An array-type electrode, comprising:
    a substrate;
    an isolating layer, disposed on one side of the substrate;
    an electrode, wherein a first part of the electrode is disposed on one side of the substrate and covered by the isolating layer; a second part of the electrode penetrates through the substrate; a third part of the electrode is disposed on the other side of the substrate; the first part is connected to the third part via the second part;
    a micro-structure layer, disposed on the isolating layer; and
    a hydrophobic layer, disposed on the micro-structure layer.

2. The array-type electrode of claim 1, wherein a surface of the micro-structure layer comprises a plurality of protrusions.

3. The array-type electrode of claim 1, wherein the substrate comprises a through hole.

4. The array-type electrode of claim 3, wherein the electrode comprises a driving electrode part, a connection part, and a conductive part; the driving electrode is disposed on one side of the substrate, the conductive part is disposed on the other side of the substrate, and the connection part is disposed inside the through hole, and coupled to the driving electrode and the conductive part.

5. The array-type electrode of claim 4, further comprising a trace, wherein the conductive part is coupled to a power source via the trace.

6. The array-type electrode of claim 1, wherein the substrate is a printing circuit board, the electrode is a copper electrode, the isolating layer is a $SiO_2$ layer, $SiN_3$ layer, or, and the hydrophobic layer is a Teflon layer.

7. A digital printing mold, comprising an electrode array, wherein the electrode array comprises a plurality of array-type electrodes, and each of the array-type electrodes comprises:
    a substrate;
    an isolating layer, disposed on one side of the substrate;
    an electrode, wherein a first part of the electrode is disposed on one side of the substrate and covered by the isolating layer; a second part of the electrode penetrates through the substrate; a third part of the electrode is disposed on the other side of the substrate; the first part is connected to the third part via the second part;
    a micro-structure layer, disposed on the isolating layer; and
    a hydrophobic layer, disposed on the micro-structure layer.

8. The digital printing mold of claim 1, wherein a surface of the micro-structure layer comprises a plurality of protrusions.

9. The digital printing mold of claim 7, wherein the substrate comprises a through hole.

10. The digital printing mold of claim 9, wherein the electrode comprises a driving electrode part, a connection part, and a conductive part; the driving electrode is disposed on one side of the substrate, the conductive part is disposed on the other side of the substrate, and the connection part is disposed inside the through hole, and coupled to the driving electrode and the conductive part.

11. The digital printing mold of claim 10, further comprising a trace, wherein the conductive part is coupled to a power source via the trace.

12. The digital printing mold of claim 7, wherein the substrate is a printing circuit board, the electrode is a copper electrode, the isolating layer is a $SiO_2$ layer, $SiN_3$ layer, or, and the hydrophobic layer is a Teflon layer.

* * * * *